(12) United States Patent
Takemura

(10) Patent No.: US 8,198,017 B2
(45) Date of Patent: Jun. 12, 2012

(54) PRODUCING METHOD OF WIRED CIRCUIT BOARD

(75) Inventor: Keiji Takemura, Osaka (JP)

(73) Assignee: Nitto Denko Corporation, Osaka (JP)

(*) Notice: Subject to any disclaimer, the term of this patent is extended or adjusted under 35 U.S.C. 154(b) by 526 days.

(21) Appl. No.: 12/320,258

(22) Filed: Jan. 22, 2009

(65) Prior Publication Data

US 2009/0202949 A1 Aug. 13, 2009

(30) Foreign Application Priority Data

Feb. 12, 2008 (JP) ................................. 2008-030940

(51) Int. Cl.
*G03F 7/20* (2006.01)
*G03F 7/40* (2006.01)

(52) U.S. Cl. ......... 430/314; 430/311; 430/394; 430/330

(58) Field of Classification Search .................. None
See application file for complete search history.

(56) References Cited

U.S. PATENT DOCUMENTS

| | | | | |
|---|---|---|---|---|
| 6,506,688 B2 * | 1/2003 | Wu | ............... | 438/759 |
| 2005/0186332 A1 | 8/2005 | Funada et al. | | |
| 2006/0269730 A1 | 11/2006 | Ishii et al. | | |
| 2007/0128554 A1 * | 6/2007 | Kawamura et al. | ........... | 430/311 |
| 2007/0158104 A1 | 7/2007 | Fujinami et al. | | |

FOREIGN PATENT DOCUMENTS

| | | |
|---|---|---|
| EP | 1675 175 | 6/2006 |
| JP | 2006-332549 | 12/2006 |

* cited by examiner

*Primary Examiner* — Daborah Chacko Davis
(74) *Attorney, Agent, or Firm* — Jean C. Edwards, Esq.; Edwards Neils PLLC

(57) ABSTRACT

A producing method of a wired circuit board includes the steps of preparing a two-layer base material including a metal supporting layer and an insulating layer, covering an upper surface of the insulating layer and respective side end surfaces of the insulating layer and the metal supporting layer with a photoresist, placing a photomask so as to light-shield an end portion and a portion where a conductive layer is to be formed of the upper surface, exposing to light the photoresist covering the upper surface from above the photoresist via the photomask, exposing to light the photoresist covering the respective side end surfaces from below the photoresist, forming an exposed portion of the photoresist into a pattern by removing an unexposed portion thereof to form a plating resist, and forming an end-portion conductive layer and the conductive layer.

4 Claims, 7 Drawing Sheets

(a)

(b)

(c)

(d)

(e)

(f)

(g)

(h)

(i)

(j)

(a)

(b)

(c)

(a)

(b)

(c)

PRODUCING METHOD OF WIRED CIRCUIT BOARD

CROSS-REFERENCE TO RELATED APPLICATION

The present application claims priority from Japanese Patent Application No. 2008-030940 filed on Feb. 12, 2008, the content of which is herein incorporated by reference in its entirety.

BACKGROUND OF THE INVENTION

1. Field of the Invention

The present invention relates to a producing method of a wired circuit board and, more particularly, to a producing method of a wired circuit board such as a chip on film (COF) board.

2. Description of the Related Art

Conventionally, an additive method has been used in the formation of a conductive pattern for a wired circuit board such as a COF board. For example, it is proposed that a conductive pattern made of copper is formed by the additive method on an insulating base layer made of polyimide which is formed on a metal supporting layer made of stainless steel (see, e.g., Japanese Unexamined Patent Publication No. 2006-332549).

That is, in Japanese Unexamined Patent Publication No. 2006-332549 mentioned above, a conductive thin film is formed on the upper surface of the insulating base layer, and then the conductive thin film is covered with a negative dry film resist. The negative dry film resist is exposed to light from thereabove via a photomask and then developed to form a plating resist in a pattern reverse to a wired circuit pattern. It is subsequently proposed that the conductive pattern is formed on the surface of the conductive thin film exposed from the plating resist through the precipitation of copper by electrolytic copper plating.

SUMMARY OF THE INVENTION

However, in the additive method, it is necessary to cover each of the side end surfaces of the metal supporting layer with the plating resist so as to prevent the precipitation of copper thereon. That is, because of poor adhesion between copper and the stainless steel of the metal supporting layer, when copper is precipitated on the side end surface of the metal supporting layer, the problem occurs that copper easily comes off the metal supporting layer to form a foreign matter. To prevent this, it is necessary to cover the side end surface of the metal supporting layer with the plating resist.

On the other hand, because the dry film resist is typically laminated by thermo-compression, a pressing force is locally placed on each of the edges of the end portions of the upper surface of the insulating base layer. As a result, the dry film resist is thinned, and may further hang down over the side end surface of the insulating base layer. When the dry film resist hangs down, a narrow vacant portion (void) where the dry film resist is missing is formed at the edge of the end portion of the upper surface of the insulating base layer. When the electrolytic copper plating is performed using the plating resist formed of such a dry film resist, copper is precipitated from the vacant portion where the photoresist is missing. This leads to the problem that, since copper is formed relatively narrow, it has poor adhesion to the insulating base layer, and comes off the insulating base layer to form a foreign matter. Therefore, it is desired to prevent the occurrence of the narrow precipitate of copper mentioned above by intentionally providing a wide copper layer over each of the end portions of the upper surface of the insulating layer, and improve the adhesion between the copper layer and the insulating layer.

To prevent the occurrence of the foreign matter mentioned above, it is necessary to cover each of the side end surfaces of the metal supporting layer with the plating resist, and also expose each of the end portions of the upper surface of the insulating base layer from the plating resist so that the wide copper layer is formed. In that case, it is necessary to provide a mask pattern in which the portion of the negative dry film resist corresponding to the side end surface of the metal supporting layer becomes an exposed portion for forming the plating resist, while the portion of the dry film resist corresponding to the end portion of the upper surface of the insulating base layer becomes an unexposed portion for forming the wide copper layer. However, it is difficult to precisely place the photomask such that the side end surface of the metal supporting layer becomes the exposed portion, and the end portion of the upper surface of the insulating base layer becomes the unexposed portion.

It is therefore an object of the present invention to provide a producing method of a wired circuit board which allows the prevention of the occurrence of a conductive foreign matter at the end portion of the upper surface of an insulating layer, and also allows easy prevention of the occurrence of the conductive foreign matter at the side end surface of the metal supporting layer.

A producing method of a wired circuit board of the present invention includes the steps of preparing a two-layer base material in which an insulating layer is laminated on a metal supporting layer, covering an upper surface of the insulating layer and respective side end surfaces of the insulating layer and the metal supporting layer with a photoresist, placing a photomask so as to light-shield an end portion and a portion where a conductive layer is to be formed on the upper surface of the insulating layer, and exposing to light the photoresist covering the upper surface of the insulating layer from above the photoresist via the photomask, exposing to light the photoresist covering the respective side end surfaces of the insulating layer and the metal supporting layer from below the photoresist, forming an exposed portion of the photoresist into a pattern by removing an unexposed portion thereof to form a plating resist, forming an end-portion conductive layer on the end portion of the upper surface of the insulating layer which is exposed from the plating resist, while simultaneously forming the conductive layer on the portion of the upper surface of the insulating layer which is exposed from the plating resist, and removing the plating resist.

In the producing method, the upper surface of the insulating layer is covered with the photoresist, the photomask is placed so as to light-shield the end portion and the portion where the conductive layer is to be formed on the upper surface of the insulating layer, and the photoresist covering the upper surface of the insulating layer is exposed to light from above the photoresist via the photomask. As a result, the unexposed portion of the photoresist is formed at each of the end portions of the upper surface of the insulating layer and the portion thereof where the conductive layer is to be formed. After the unexposed portion of the photoresist is removed, when the plating resist is formed, the end-portion conductive layer can be formed at the end portion of the upper surface of the insulating layer which is exposed from the plating resist, while the conductive layer can be formed simultaneously at the portion of the upper surface of the insulating layer which is exposed from the plating resist. Accordingly, it is possible to form the conductive layer, while forming the end-portion conductive layer at the end portion of the insulating base layer, and prevent the occurrence of a narrow precipitate of a conductive material to allow an improvement in the adhesion between the end-portion conductive layer and the insulating layer. Therefore, the wired circuit board with high connection reliability can be obtained by preventing the occurrence of a conductive foreign matter at the end portion of the upper surface of the insulating layer.

Additionally, in the producing method, the respective side end surfaces of the insulating layer and the metal supporting layer are covered with the photoresist, and the photoresist is exposed to light from below the photoresist. This allows easy exposure to light of the photoresist covering the respective side end surfaces of the insulating layer and the metal supporting layer. As a result, the plating resist can be formed from the exposed portion to cover the respective side end surfaces of the insulating layer and the metal supporting layer. Therefore, it is possible to easily prevent the precipitation of the conductive material on the side end surface of the metal supporting layer and, consequently, it is possible to easily prevent the occurrence of a conductive foreign matter at the side end surface of the metal supporting layer.

In the producing method of the wired circuit board of the present invention, it is preferable that the photoresist is formed from a dry film resist.

When the dry film resist is laminated on the upper surface of the insulating layer, a pressing force resulting from thermocompression is locally placed on the edge of the end portion of the upper surface of the insulating layer, so that a vacant portion is likely to be formed. This leads to the problem that, in the formation of the conductive layer, a narrow precipitate of the conductive material unintentionally occurs due to the vacant portion.

However, in the producing method, the photoresist is formed from the dry film resist, the photomask is placed so as to light-shield the end portion of the upper surface of the insulating layer, and then the photoresist is exposed to light from above the photoresist via the photomask, as described above. As a result, it is possible to form the conductive layer, while intentionally forming the end-portion conductive layer at the end portion of the insulating layer, and prevent the occurrence of a narrow precipitate of the conductive material to allow an improvement in the adhesion between the end-portion conductive layer and the insulating layer. Therefore, the wired circuit board with high connection reliability can be obtained by preventing the occurrence of the conductive foreign matter over the end portion of the upper surface of the insulating layer.

In the producing method of the wired circuit board of the present invention, it is preferable that the step of covering the upper surface of the insulating layer and the respective side end surfaces of the insulating layer and the metal supporting layer includes laminating a resin supporting layer on a lower surface of the metal supporting layer such that the metal supporting layer and the photoresist covering the side end surface of the metal supporting layer are included therein.

In the producing method, when the resin supporting layer is laminated and the photoresist is simultaneously laminated on the upper surface of the resin supporting layer, This allows to easy and reliable coverage of the side end surface of the metal supporting layer.

In addition, because it is possible to reinforce the metal supporting layer and the insulating layer with the resin supporting layer, and impart toughness to the laminate structure thereof, a conductive pattern can be formed with excellent accuracy.

It is preferable that the producing method of the wired circuit board of the present invention further includes, after the covering step, the step of heating the photoresist covering the respective side end surfaces of the insulating layer and the metal supporting layer.

In general, after the covering step, air bubbles may be formed in the photoresist covering the respective side end surfaces of the insulating layer and the metal supporting layer. However, in the producing method, the photoresist covering the respective side end surfaces of the insulating layer and the metal supporting layer is heated after the covering step. As a result, it is possible to reduce the number or volume of such air bubbles, and further remove the air bubbles.

DETAILED DESCRIPTION OF THE INVENTION

Figure 1:
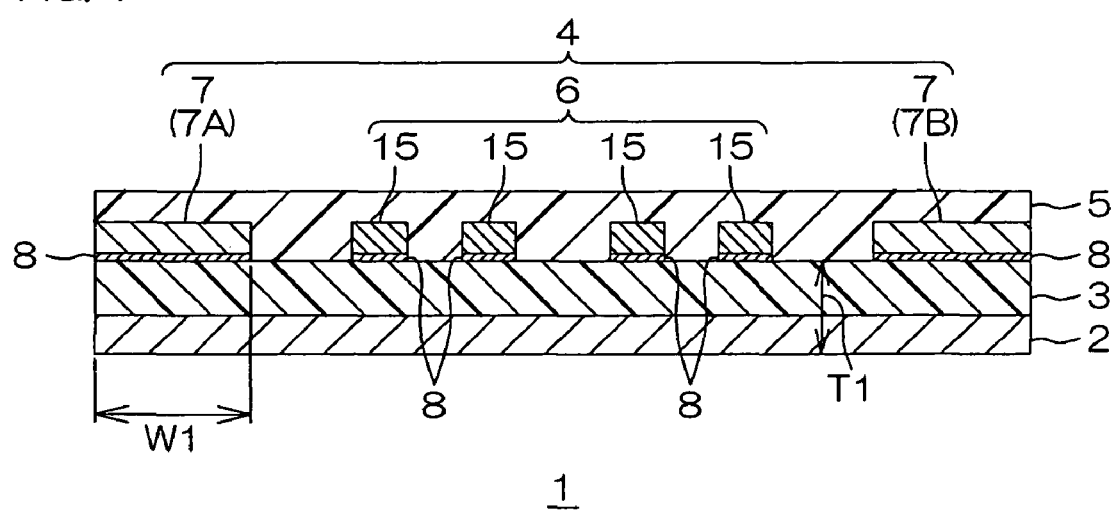
FIG. 1 is a cross-sectional view along a widthwise direction of a wired circuit board which is produced by a producing method of a wired circuit board according to an embodiment (which includes a metal supporting layer) of the present invention.
Figure 2:
FIG. 2 is a process view of the producing method of the wired circuit board according to the embodiment of the present invention, (a) showing the step of preparing a two-layer base material, (b) showing the step of forming a conductive thin film on the entire upper surface of an insulating base layer, (c) showing the step of forming photoresists, while simultaneously forming a resin supporting layer, and (d) showing the step of exposing the photoresists to light from thereabove via a photomask.
Figure 2:
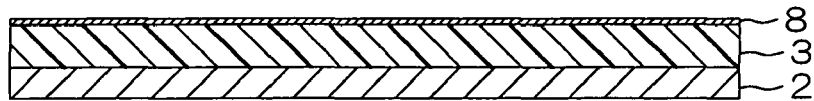
Figure 2:
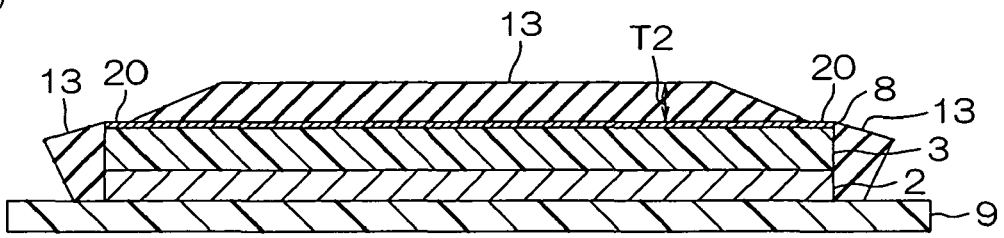
Figure 2:
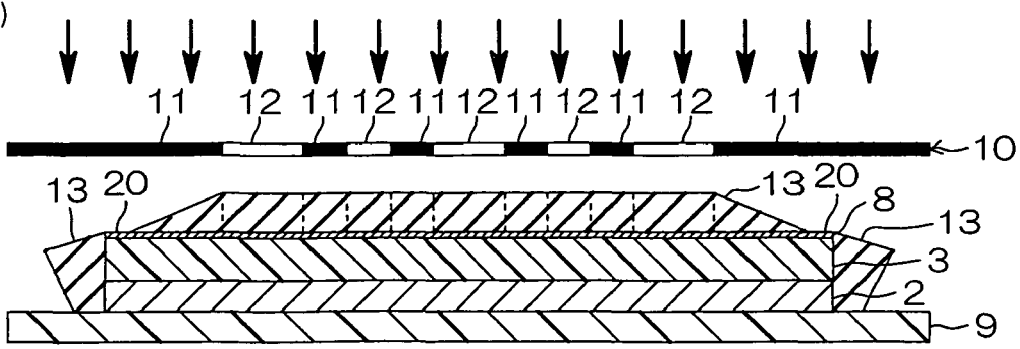
Figure 3:
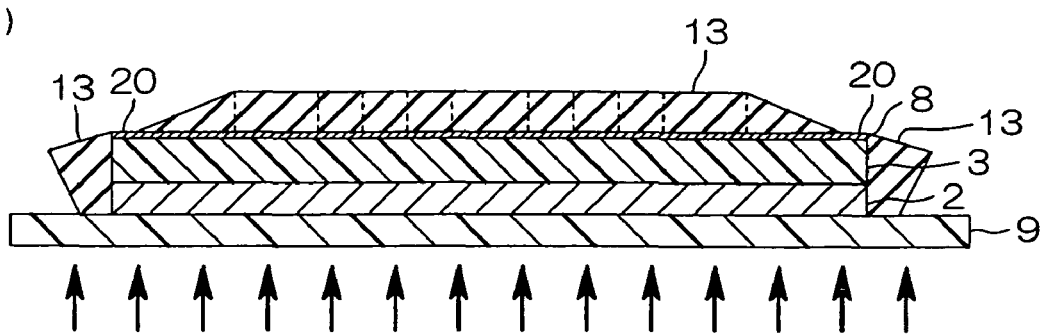
FIG. 3 is a process view of the producing method of the wired circuit board according to the embodiment of the present invention, which is subsequent to FIG. 2, (e) showing the step of exposing to light the photoresists covering both of the widthwise side end surfaces of the insulating base layer and a metal supporting layer, (f) showing the step of forming the exposed portions of the photoresists into a pattern by removing the unexposed portions thereof to form plating resists, and (g) showing the step of simultaneously forming end-portion conductive layers and a conductive layer over the insulating base layer exposed from the plating resists.
Figure 3:
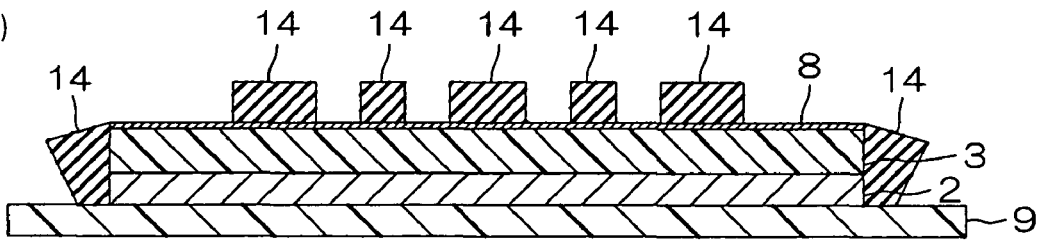
Figure 3:
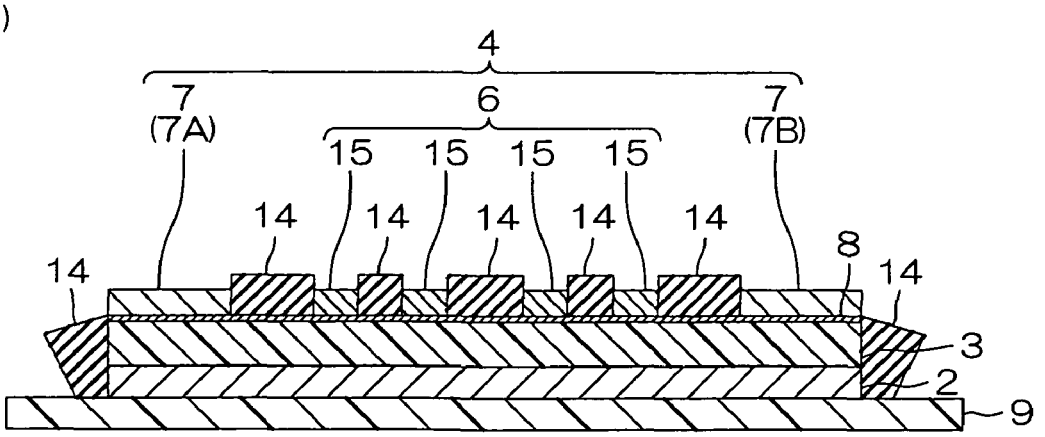
Figure 4:
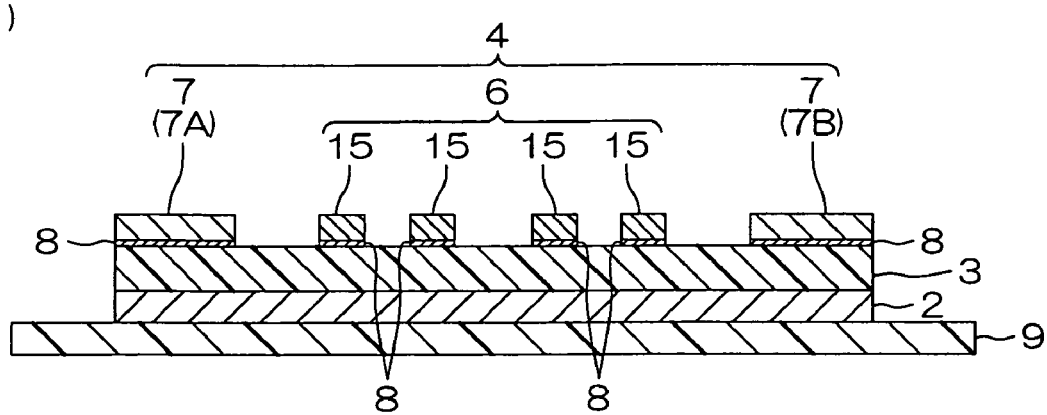
FIG. 4 is a process view of the producing method of the wired circuit board according to the embodiment of the present invention, which is subsequent to FIG. 3, (h) showing the step of successively removing the plating resists and the portions of the conductive thin film where the plating resists are formed, (i) showing the step of forming an insulating cover layer over the insulating base layer, and (j) showing the step of removing the resin supporting layer.
Figure 4:
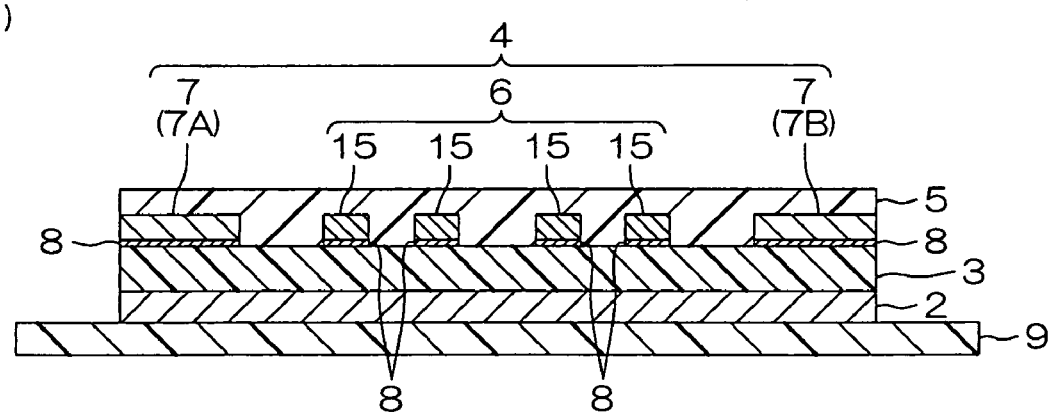
Figure 4:
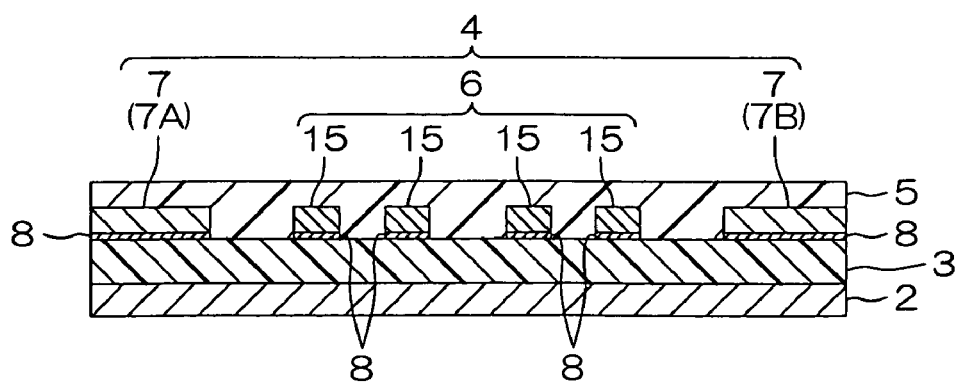

FIG. 1 is a cross-sectional view along a widthwise direction of a wired circuit board which is produced by a producing method of a wired circuit board according to an embodiment of the present invention. FIGS. 2 to 4 are process views of the producing method of the wired circuit board according to the embodiment of the present invention.

In FIG. 1, the wired circuit board 1 is a COF board in which an IC chip not shown is mounted, and which is mounted in various electronic equipment. The wired circuit board 1 includes a metal supporting layer 2 extending in a longitudinal direction, and an insulating base layer 3 as an insulating layer formed on the metal supporting layer 2. The wired circuit board 1 also includes a conductive pattern 4 formed on the insulating base layer 3, and an insulating cover layer 5 formed on the insulating base layer 3 so as to cover the conductive pattern 4.

The metal supporting layer 2 is a reinforcing layer. Examples of a metal material used to form the metal supporting layer 2 include stainless steel, and 42-alloy. Preferably, stainless steel is used to form the metal supporting layer 2.

The metal supporting layer 2 is made of a metal foil in the shape of a flat plate or a metal thin plate. The thickness of the metal supporting layer 2 is in a range of, e.g., 5 to 100 µm, or preferably 10 to 50 µm.

The insulating base layer 3 is formed on the surface of the metal supporting layer 2. More specifically, the insulating base layer 3 is formed on the entire upper surface of the metal supporting layer 2 along a widthwise direction (perpendicular to the longitudinal direction). That is, the widthwise end edges of the insulating base layer 3 are formed at the same positions as the widthwise end edges of the metal supporting layer 2 when viewed in plan view. In other words, both of the widthwise side end surfaces of the insulating base layer 3 are formed flush with both of the widthwise side end surfaces of the metal supporting layer 2 in a thickness direction.

Examples of an insulating material used to form the insulating base layer 3 include synthetic resins such as polyimide, polyether nitrile, polyether sulfone, polyethylene terephthalate, polyethylene naphthalate, and polyvinyl chloride. Among them, polyimide is preferably used to form the insulating base layer 3.

The thickness of the insulating base layer 3 is in a range of, e.g., 1 to 50 µm, or preferably 20 to 40 µm. The total thickness T1 of the metal supporting layer 2 and the insulating base layer 3 is set to a range of, e.g., 6 to 150 µm, or preferably 30 to 90 µm.

The conductive pattern 4 includes a conductive layer 6 and end-portion conductive layers 7.

The conductive layer 6 is provided at a widthwise middle position over the insulating base layer 3. That is, the conductive layer 6 is disposed to be spaced apart from the edges of both of the widthwise end portions to ensure regions (both widthwise end portions) where the end-portion conductive layers 7 are formed. More specifically, the conductive layer 6 is formed at a generally center portion in the widthwise direction. The conductive layer 6 is formed in a wired circuit pattern which integrally includes a plurality of wires 15 extending in parallel along the longitudinal direction, and arranged to be spaced apart from each other in the widthwise direction, and terminal portions, not shown, which are continued to both of the longitudinal end portions of the individual wires 15.

The end-portion conductive layers 7 are provided over both of the widthwise end portions of the insulating base layer 3, and disposed on both widthwise outsides of the conductive layer 6 to oppose both of the widthwise outermost wires 15 in spaced-apart relation. The individual end-portion conductive layers 7 are formed in a pattern in which they are parallel with both of the widthwise end edges of the insulating base layer 3. Each of the end-portion conductive layers 7 is formed to have a generally rectangular flat cross-sectional shape. The individual end-portion conductive layers 7 are formed such that the respective widthwise outer end edges thereof, i.e., the one widthwise end edge of a first end-portion conductive layer 7A disposed on one widthwise side and the other widthwise end edge of a second end-portion conductive layer 7B disposed on the other widthwise side are formed at the same positions as both of the widthwise end edges of the insulating base layer 3 when viewed in plan view. That is, the one widthwise side end surface of the first end-portion conductive layer 7A and the other widthwise side end surface of the second end-portion conductive layer 7B are formed flush with both of the widthwise side end surfaces of the insulating base layer 3 in the thickness direction.

Examples of a conductive material used to form the conductive pattern 4 include copper, nickel, gold, a solder, and an alloy thereof. Preferably, copper is used to form the conductive pattern 4.

The width of each of the wires 15 is in a range of, e.g., 5 to 100 µm, or preferably 5 to 50 µm. The spacing between the individual wires 15 is in a range of, e.g., 5 to 100 µm, or preferably 5 to 50 µm.

The width W1 of each of the end-portion conductive layers 7 is in a range of, e.g., not less than 50 µm, preferably not less than 200 µm, or more preferably not less than 1000 µm, and normally not more than 10 mm. When the width W1 of each of the end-portion conductive layers 7 is under the range shown above, the adhesion between the end-portion conductive layers 7 and the insulating base layer 3 may deteriorate to cause the occurrence of a conductive foreign matter.

The insulating cover layer 5 is formed on the respective surfaces of the insulating base layer 3 and the conductive pattern 4 correspondingly to the conductive pattern 4.

To form the insulating cover layer 5, the same insulating material as used to form the insulating base layer 3 mentioned above is used.

The thickness of the insulating cover layer 5 is in a range of, e.g., 1 to 40 µm, or preferably 3 to 10 µm.

In the wired circuit board 1, a conductive thin film (seed film) 8 is formed on the lower surface of the conductive pattern 4.

The conductive thin film 8 is formed in the same pattern as the conductive pattern 4 to be interposed between the insulating base layer 3 and the conductive pattern 4.

Examples of a conductive material used to form the conductive thin film 8 include copper and chromium. The thickness of the conductive thin film 8 is in a range of, e.g., 20 to 500 nm, or preferably 50 to 300 nm.

Next, a description is given to a producing method of a wired circuit board according to an embodiment of the present invention with reference to FIGS. 2 to 4.

First, as shown in FIG. 2(*a*), a two-layer base material in which the insulating base layer 3 is laminated on the metal supporting layer 2 is prepared.

To prepare the two-layer base material, a commercially available two-layer base material may be used without any modification. The two-layer base material may also be prepared by laminating the insulating base layer 3 on the surface of the metal supporting layer 2.

Next, as shown in FIGS. 2(*b*) to 3(*g*), the conductive pattern 4 is formed on the insulating base layer 3. The conductive pattern 4 is formed by, e.g., an additive method, or more specifically a semi-additive method.

To form the conductive pattern 4 by the semi-additive method, the conductive thin film 8 is formed first on the entire upper surface of the insulating base layer 3, as shown in FIG. 2(*b*).

The conductive thin film 8 is formed by, e.g., sputtering, electrolytic plating, or electroless plating. Preferably, the conductive thin film 8 is formed by sputtering.

Next, as shown in FIG. 2(*c*), the upper surface of the insulating base layer 3, and the respective side end surfaces of the insulating base layer 3 and the metal supporting layer 2 are covered with photoresists 13 (covering step). At the same time, a resin supporting layer 9 is laminated on the lower surface of the metal supporting layer 2 so as to include the metal supporting layer 2 and the photoresists 13 covering the side end surfaces of the metal supporting layer 2.

To cover the upper surface of the insulating base layer 3, and the respective side end surfaces of the insulating base layer 3 and the metal supporting layer 2 with the photoresists 13, a photoresist laminate material including a supporting layer made of polyethylene terephthalate (PET) or the like, the photoresist 13 made of a negative dry film resist, a release layer laminated on the photoresist and made of PET or the like to which release treatment has been performed, and the like is prepared first, though not shown.

The size of the photoresist laminate material is set to be larger than that of the insulating base layer 3 so that the respective side end surfaces of the insulating base layer 3 and the metal supporting layer 2 are covered with the photoresists 13. For example, the width of the photoresist laminate material is set to be larger than that of the insulating base layer 3 by 1 mm or more, or preferably 3 mm or more (normally 5 mm or less). The thickness T2 of the photoresist 13 is in a range of, e.g., 15 to 50 µm, or preferably 15 to 25 µm.

Next, after the release layer is stripped from the photoresist 13, the photoresist laminate material is thermo-compressed from the supporting layer toward the photoresist 13 so that the photoresist 13 comes in contact with the upper surface of the insulating base layer 3. Specifically, the photoresist laminate material is thermo-compressed at a temperature in a range of, e.g., 50 to 150° C., or preferably 80 to 110° C. under a pressure in a range of 0.20 to 0.50 MPa.

Thereafter, the supporting layer is stripped from the photoresist 13.

To laminate the resin supporting layer 9 on the lower surface of the metal supporting layer 2 simultaneously with the coverage with the photoresists 13 mentioned above, a resin supporting layer laminate material including the resin supporting layer 9, an adhesive layer laminated on the resin supporting layer 9, a release layer laminated on the adhesive layer and made of PET or the like to which release treatment has been performed, and the like is prepared first, though not shown.

The resin supporting layer 9 may be formed appropriately from a resin material which does not inhibit exposure to light (which is capable of transmitting light) performed from below the resin supporting layer 9, which is described later. For example, the resin supporting layer 9 is made of a transparent synthetic resin such as polyethylene, polypropylene, polyethylene terephthalate (PET), or polyethylene naphthalate.

The size of the resin supporting layer laminate material is appropriate as long as the metal supporting layer 2, and the photoresists 13 covering the side end surfaces of the metal supporting layer 2 are included therein. The width of the resin supporting layer laminate material is set to be larger than that of the metal supporting layer 2 by 1 mm or more, or preferably 4 mm or more (normally 10 mm or less). The thickness of the resin supporting layer 9 is in a range of, e.g., 25 to 150 µm, or preferably 50 to 100 µm.

Next, the release layer is stripped from the adhesive layer, and the resin supporting laminate material is laminated so that the adhesive layer comes in contact with the lower surface of the metal supporting layer 2.

The photoresist 13 and the resin supporting layer 9 are simultaneously formed, while the insulating base layer 3 and the metal supporting layer 2 are interposed between the photoresist laminate material (photoresist 13) and the resin supporting layer laminate material (resin supporting layer 9) in the thickness direction.

Since the photoresist 13 is thermo-pressed at each of the edges of both of the widthwise end portions of the upper surface of the insulating base layer 3, the photoresist 13 after lamination hangs down (fluidly moves) over each of the two widthwise side end surfaces of the insulating base layer 3. As a result, a vacant portion (void) 20 where the photoresist 13 is missing is formed in the photoresist 13. The width of the vacant portion 20 is typically in a range of 3 to 50 µm.

The portion of the photoresist 13 which is widthwise inner than the vacant portion 20 has a reduced thickness. Specifically, the widthwise inner portion is formed to have a thickness which is gradually smaller with approach toward both widthwise outsides.

Each of the photoresists 13 formed on both of the widthwise side end surfaces of the insulating base layer 3 has a width which is gradually larger upwardly in the thickness direction by fluid moving thereof at the vacant portion mentioned above, and is formed to have a generally trapezoidal cross-sectional shape.

Next, the photoresists 13 covering the respective side end surfaces of the insulating base layer 3 and the metal supporting layer 2 are heated.

The photoresists 13 are heated by heating the wired circuit board 1 covered with the photoresist 13 in the middle of the production thereof at a temperature in a range of, e.g., 60 to 150° C., or preferably 80 to 120° C. immediately after the covering step. The photoresists 13 are heated in, e.g., atmospheric air or an inert gas atmosphere of nitrogen or the like for, e.g., 15 to 60 seconds, or preferably 15 to 30 seconds.

Next, as shown in FIG. 2(*d*), a photomask 10 is placed so as to light-shield both of the widthwise end portions of the upper surface of the insulating base layer 3, the widthwise generally center portion thereof (i.e., the portion thereof other than both of the widthwise end portions) where the conductive layer 6 is to be formed, and the photoresists 13 covering both of the widthwise side end surfaces of the insulating base layer 3 and the metal supporting layer 2, and then the photoresist 13 covering the upper surface of the insulating base layer 3 is exposed to light from thereabove via the photomask 10.

The photomask 10 has a mask pattern including light shielding portions 11 and light transmitting portions 12. The photomask 10 is placed over the photoresists 13 in spaced-apart relation such that the shielding portions 11 oppose the portions of the photoresist 13 corresponding to the portions where the conductive layer 6 and the end-portion conductive layers 7 are to be formed as well as the photoresists 13 covering both of the widthwise side end surfaces of the insulating base layer 3 and the metal supporting layer 2, and the light transmitting portions 12 oppose the portions of the photoresist 13 corresponding to the portions (the portions in a pattern reverse to those of the conductive layer 6 and the end-portion conductive layers 7) of the upper surface of the insulating base layer 3 where plating resists 14 are to be formed.

With the photomask 10 being thus placed, the portion of the photoresist 13 corresponding to the portion where each of the end-portion conductive layers 7 is to be formed and the photoresist 13 covering the corresponding widthwise side end surfaces of the insulating base layer 3 and the metal supporting layer 2 are shielded from light by the single continuous light shielding portion 11.

After the photomask 10 is placed, the photoresists 13 are exposed to light from thereabove via the photomask 10.

For the exposure to light, light such as an ultraviolet ray is used, and the dose thereof is in a range of, e.g., 50 to 500 mJ/cm$^2$.

In the exposure to light from above the photoresists 13, the portions where the plating resists 14 are to be formed become exposed portions, while the other portions (portions covering the conductive layer 6, the end-portion conductive layers 7, and both of the widthwise side end surfaces of the insulating base layer 3 and the metal supporting layer 2) become unexposed portions.

Next, as shown in FIG. 3(e), the photoresists 13 covering both of the widthwise side end surfaces of the insulating base layer 3 and the metal supporting layer 2 are exposed to light from therebelow.

The photoresists 13 are exposed to light from therebelow via the resin supporting layer 9 without additionally providing the photomask 10. In the exposure to light, the metal supporting layer 2 also serves as a photomask.

For the exposure to light, light such as, e.g., an ultraviolet ray is used, and the dose thereof is in a range of, e.g., 50 to 500 mJ/cm$^2$.

In the exposure to light of the photoresists 13 performed from therebelow, the photoresists 13 covering both of the widthwise side end surfaces of the insulating base layer 3 and the metal supporting layer 2, i.e., the unexposed portions in the exposure to light of the photoresist 13 performed from thereabove become exposed portions.

Next, as shown in FIG. 3(f), the unexposed portions of the photoresists 13 are removed, and the exposed portions thereof are formed into a pattern to form the plating resists 14.

To form the plating resists 14 by removing the unexposed portions of the photoresists 13, and forming the exposed portions thereof into the pattern, the unexposed portions are removed first by development using a known developer, and then the remaining exposed portions are dried.

Next, as shown in FIG. 3(g), the end-portion conductive layers 7 and the conductive layer 6 are simultaneously formed over both of the widthwise end portions of the upper surface of the insulating base layer 3 which are exposed from the plating resists 14 and over the widthwise generally center portion thereof which is exposed from the plating resists 14, respectively.

To form the end-portion conductive layers 7 and the conductive layer 6, e.g., electrolytic plating or the like is used.

In the electrolytic plating, the end-portion conductive layers 7 and the conductive layer 6 can be simultaneously formed through the simultaneous precipitation thereof over the upper surface of the conductive thin film 8 exposed from the plating resists 14 with the supply of electric power from the conductive thin film 8. The conductive thin film 8 supplies the electric power supplied from a power supply device not shown via the metal supporting layer 2.

Next, as shown in FIG. 4(h), the plating resists 14 and the portions of the conductive thin film 8 where the plating resists 14 are formed are successively removed. To remove the plating resists 14 and the conductive thin film 8, e.g., etching, stripping, or the like is used.

In this manner, the conductive pattern 4 can be formed on the insulating base layer 3.

Next, as shown in FIG. 4(j), the insulating cover layer 5 is formed in the foregoing pattern on the insulating base layer 3.

To form the insulating cover layer 5, a solution (varnish) of the synthetic resin mentioned above is uniformly coated on the entire upper surface of each of the insulating base layer 3 and the conductive pattern 4, dried, and then cured by heating as necessary. Alternatively, the insulating cover layer 5 is formed by, e.g., coating a photosensitive varnish on the entire upper surface of each of the insulating base layer 3 and the conductive pattern 4, drying the coated varnish, exposing it to light, developing it in the foregoing pattern, and then curing it by heating as necessary. Otherwise, the insulating cover layer 5 can be formed by, e.g., preliminarily forming a synthetic resin into a film in the foregoing pattern, and then sticking the film to the entire upper surface of each of the insulating base layer 3 and the conductive pattern 4 via a known adhesive layer.

Thereafter, as shown in FIG. 4(j), the resin supporting layer 9 is removed by stripping or etching, or preferably by stripping.

In this manner, the wired circuit board 1 can be formed.

In accordance with the method, the upper surface of the insulating base layer 3 is covered with the photoresist 13, the photomask 10 is placed so as to light-shield both of the widthwise end portions of the upper surface of the insulating base layer 3 and the widthwise generally center portion thereof where the conductive layer 6 is to be formed, and then the photoresist 13 covering the upper surface of the insulating base layer 3 is exposed to light from thereabove via the photomask 10. As a result, the unexposed portions of the photoresist 13 are formed over both of the widthwise end portions of the upper surface of the insulating base layer 3 and over the widthwise generally center portion thereof where the conductive layer 6 is to be formed. Then, after the unexposed portions of the photoresist 13 are removed, when the plating resists 14 are formed, the end-portion conductive layers 7 can be formed over both of the widthwise end portions of the upper surface of the insulating base layer 3 which are exposed from the plating resists 14, while the conductive layer 6 can be formed simultaneously over the widthwise generally center portion thereof which is exposed from the plating resists 14. As a result, it is possible to form the conductive layer 6, while forming the end-portion conductive layers 7 at both of the widthwise end portions of the insulating base layer 3, and prevent the occurrence of a narrow precipitate of a conductive material (which is specifically copper or the like) due to the vacant portion 20 where the photoresist 13 is missing during electrolytic plating, to allow an improvement in the adhesion between the end-portion conductive layers 7 and the insulating base layer 3. Therefore, the wired circuit board 1 with high connection reliability can be obtained by preventing the occurrence of a conductive foreign matter (which is specifically a foreign matter of copper) over both of the widthwise end portions of the upper surface of the insulating base layer 3.

On the other hand, in accordance with the producing method, both of the widthwise side end surfaces of the insulating base layer 3 and the metal supporting layer 2 are covered with the photoresists 13, and the photoresists 13 are exposed to light from therebelow. This allows easy exposure to light of the photoresists 13 covering both of the widthwise side end surfaces of the insulating base layer 3 and the metal supporting layer 2. As a result, the plating resists 14 can be formed to cover both of the widthwise side end surfaces of the insulating base layer 3 and the metal supporting layer 2. Therefore, it is possible to easily prevent the precipitation of a conductive material (which is specifically copper or the like) at both of the widthwise side end surfaces of the metal supporting layer 2 and, consequently, it is possible to easily prevent the occurrence of a conductive foreign matter (which is specifically a foreign matter of copper) at both of the end surfaces of the metal supporting layer 2.

In the description given above, the photoresist 13 is formed from the dry film resist. However, the photoresist 13 can also be formed from, e.g., a photosensitive varnish.

When the photoresist 13 is formed from the dry film resist over the upper surface of the insulating base layer 3, a pressing force resulting from thermo-compression is locally placed on each of the edges of both of the widthwise end portions of the upper surface of the insulating base layer 3, so that the vacant portion 20 is particularly likely to be formed. As a result, a narrow precipitate of the conductive material unintentionally occurs due to the vacant portion 20 in the formation of the conductive layer 6 by electrolytic plating.

However, when the photomask 10 is placed so as to light-shield both of the widthwise end portions of the upper surface of the insulating base layer 3, and the photoresists 13 are exposed to light from thereabove via the photomask 10 as described above, it is possible to form the conductive layer 6, while intentionally forming the end-portion conductive layers 7 on both of the widthwise end portions of the insulating base layer 3. As a result, even when the vacant portion 20 is formed due to the dry film resist, the occurrence of the narrow precipitate of the conductive material is prevented to allow an improvement in the adhesion between the end-portion conductive layers 7 and the insulating base layer 3. Therefore, it is possible to prevent the occurrence of the foreign matter of the conductive material over both of the widthwise end portions of the upper surface of the insulating base layer 3 and, consequently, it is possible to obtain the wired circuit board 1 with high connection reliability.

In the description given above, the photoresists 13 are formed simultaneously with the formation of the resin supporting layer 9 on the lower surface of the metal supporting layer 2, as shown in FIG. 2(c). However, it is also possible to, e.g., omit the formation the resin supporting layer 9, or form a photoresist (lower-surface photoresist) instead of the resin supporting layer 9, though not shown.

Preferably, the photoresists 13 are laminated at the same time as the resin supporting layer 9 is formed. This allows the photoresists 13 formed on both of the widthwise side end surfaces of the metal supporting layer 2 to be supported by the resin supporting layer 9 from thereunder, and therefore allows easy and reliable coverage of both of the widthwise side end surfaces of the metal supporting layer 2.

In addition, because it is possible to reinforce the metal supporting layer 2 and the insulating base layer 3 with the resin supporting layer 9, and impart toughness to the laminate structure thereof, the conductive pattern 4 can be formed with excellent accuracy.

Figure 7:
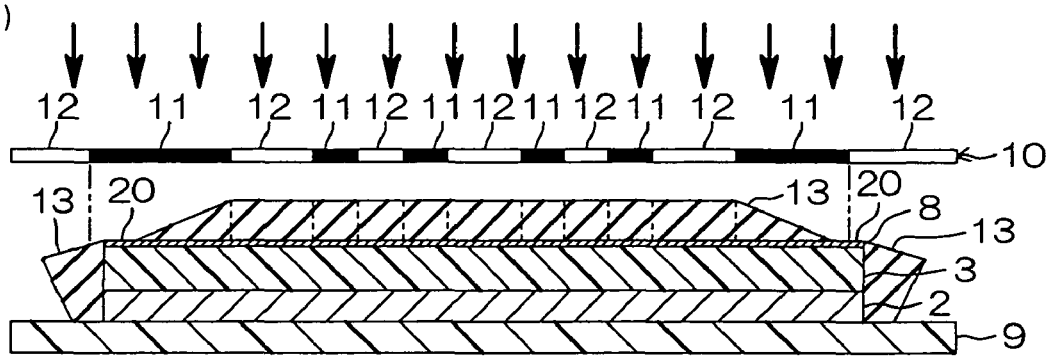
FIG. 7 is a process view of a producing method of a COF board according to COMPARATIVE EXAMPLE 2, (a) showing the step of placing a photomask so as to light-shield only a widthwise center portion where a conductive layer is to be formed and both widthwise end portions where end-portion conductive layers are to be formed, and exposing photoresists to light from thereabove via the photomask, (b) showing the step of forming the exposed portions of the photoresists into a pattern by removing the unexposed portions thereof to form plating resists, and (c) showing the step of forming the conductive layer and the end-portion conductive layers over an insulating base layer exposed from the plating resists.
Figure 7:
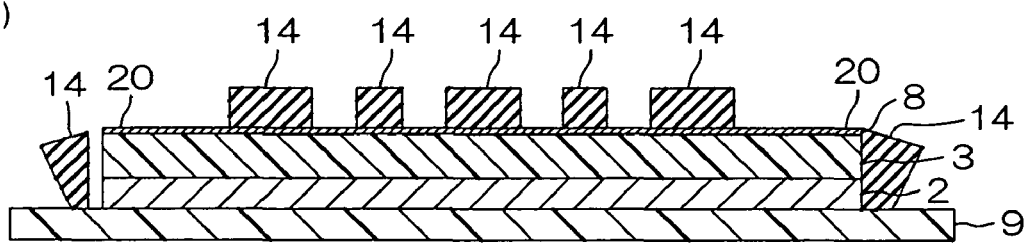
Figure 7:
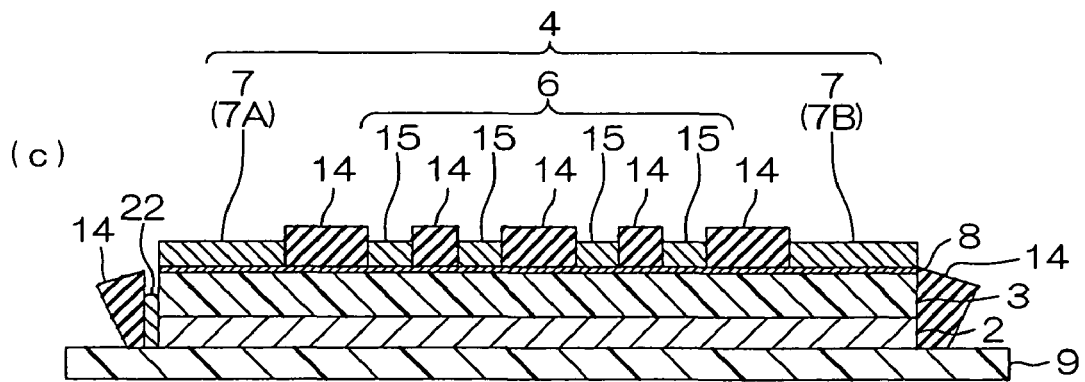

In the description given above, the photomask 10 is placed to position the light shielding portions 11 in opposing relation to the portions of the photoresist 13 corresponding to the portions where the conductive layer 6 and the end-portion conductive layers 7 are to be formed and to the photoresists 13 covering both of the widthwise side end surfaces of the insulating base layer 3 and the metal supporting layer 2, as shown in FIG. 2(d). However, the placement of the photomask 10 is not limited thereto. As long as the placement of the photomask 10, it is sufficient to light-shield the portions of the photoresist 13 where the conductive layer 6 and the end-portion conductive layers 7 are to be formed. As referenced in FIG. 7(a), it is also possible to, e.g., place the photomask 10 having a mask pattern which allows the light shielding portions 11 to be positioned in opposing relation to the portions of the photoresists 13 corresponding to the portions where the conductive layer 6 and the end-portion conductive layers 7 are to be formed, and expose the photoresists 13 to light from thereabove to turn the photoresists 13 covering both of the widthwise side end surfaces of the insulating base layer 3 and the metal supporting layer 2 into exposed portions.

In this case, even when a displacement of the photomask 10 occurs to form unexposed portions in the photoresists 13 covering both of the widthwise side end surfaces of the insulating base layer 3 and the metal supporting layer 2 as indicated by the imaginary lines of FIG. 7(a), such unexposed portions can be changed into exposed portions since the photoresists 13 are exposed to light from therebelow, as shown in FIG. 3(e). This allows reliable prevention of the precipitation of the conductive material on both of the widthwise side end surfaces of the metal supporting layer 2.

In the description given above, the photoresists 13 are first exposed to light from thereabove, and then exposed to light from therebelow, as shown in FIGS. 2(d) and 3(e). However, the order of exposure to light is not limited thereto. The photoresists 13 can also be exposed to light in an order reverse to the order shown above.

In the description given above, the conductive pattern 4 is formed by the semi-additive method, as shown in FIGS. 2(b) to 4(h). However, the method for forming the conductive pattern 4 is not limited thereto as long as it is an additive method. For example, the conductive pattern 4 can also be formed by a full-additive method, though not shown. In the full-additive method, the formation of the conductive thin film 8 shown in FIG. 2(b) is omitted, or a catalyst layer is formed instead of the conductive thin film 8 and, in addition, electroless plating is used instead of electrolytic plating in the formation of the conductive layer 6 and the end-portion conductive layers 7 shown in FIG. 3(g).

In the description given above, the photoresists 13 are heated after the covering step. However, the photoresists 13 may also be exposed to light 13 without being heated after the covering step.

Preferably, the photoresists 13 are heated after the covering step.

In general, after the covering step, air bubbles may be formed in the photoresists 13 covering the side end surfaces of the insulating base layer 3 and the metal supporting layer 2. In particular, when the total thickness T1 of the metal supporting layer 2 and the insulating base layer 3, i.e., the thickness T1 of the two-layer base material is larger than the thickness T2 of the photoresist 13, or when the thickness T1 of the two-layer base material is larger than triple the thickness T2 of the photoresist 13, the air bubbles mentioned above are likely to be formed.

However, by heating the photoresists 13 covering the side end surfaces of the insulating base layer 3 and the metal supporting layer 2 after the covering step, the volume of such bubbles can be significantly reduced.

In the description given above, the wired circuit board of the present invention is shown, by way of example, as the COF board including the metal supporting layer 2 as the reinforcing layer. However, the wired circuit board of the present invention is not limited thereto. For example, as shown in FIG. 5, the wired circuit board of the present invention is widely applicable to another wired circuit board such as a COF board which does not include the metal supporting layer 2.

Figure 5:
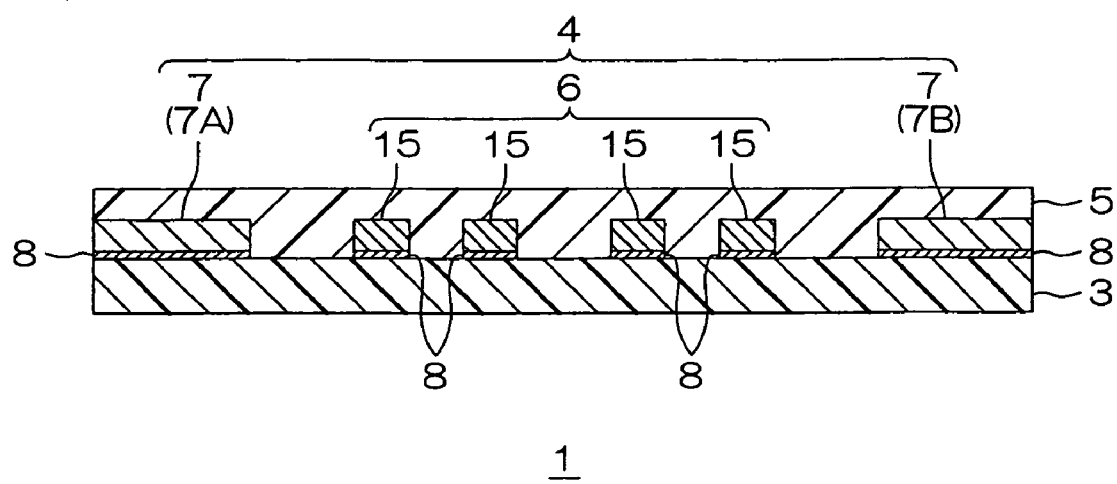
FIG. 5 is a cross-sectional view along a widthwise direction of a wired circuit board which is produced by a producing method of a wired circuit board according to another embodiment (which does not include a metal supporting layer) of the present invention.

In FIG. 5, the wired circuit board 1 includes the insulating base layer 3, the conductive pattern 4 formed on the insulating base layer 3, and the insulating cover layer 5 formed on the insulating base layer 3 so as to cover the conductive pattern 4.

To produce the wired circuit board 1, after the wired circuit board 1 supported by the metal supporting layer 2 is obtained, the metal supporting layer 2 is removed by etching in accordance with the method shown in FIGS. 2(a) to 4(j) described above.

EXAMPLES

The present invention is described more specifically by showing the example and the comparative examples hereinbelow. However, the present invention is by no means limited to the example and the comparative examples.

Example 1

First, a two-layer base material (with a thickness T1 of 60 μm and a width of 300 mm) in which an insulating base layer made of polyimide with a thickness of 35 μm was laminated on a metal supporting layer made of stainless steel with a thickness of 25 μm was prepared (see FIG. 2(a)).

Then, a chromium thin film with a thickness of 0.02 μm and a copper thin film with a thickness of 0.13 μm were successively formed, each as a conductive thin film, on the entire upper surface of the insulating base layer by chromium sputtering and copper sputtering (see FIG. 2(b)).

Then, a photoresist laminate material (with a width of 303 mm) in which a supporting layer, a negative photoresist (with a thickness T2 of 15 μm), and a release layer were successively laminated was prepared. Thereafter, the release layer of the photoresist laminate material was stripped, and the photoresist laminate material was thermo-compressed at a temperature of 90° C. under a pressure of 0.3 MPa so that the photoresist came in contact with the upper surface of the insulating base layer.

On the other hand, a resin supporting layer laminate material (with a width of 304 mm) in which a resin supporting layer (with a thickness of 50 μm), an adhesive layer, and a release layer were successively laminated was prepared. Thereafter, the release layer of the resin supporting layer laminate material was stripped, and the resin supporting layer laminate material was laminated simultaneously with the thermo-compression of the photoresist laminate material mentioned above so that the adhesive layer came in contact with the lower surface of the metal supporting layer.

In this manner, the upper surface of the insulating base layer and both of the widthwise side end surfaces of the insulating base layer and the metal supporting layer were covered with the photoresists, while the resin supporting layer was simultaneously laminated on the lower surface of the metal supporting layer so as to include the metal supporting layer and the photoresist covering both of the widthwise side end surfaces of the insulating base layer and the metal supporting layer (see FIG. 2(c)).

Then, immediately after the coverage with the photoresist, the photoresist was heated in atmospheric air at 90° C. for 20 seconds.

Subsequently, the photomask was placed so as to light-shield both of the widthwise end portions of the upper surface of the insulating base layer where end-portion conductive layers were to be formed, the widthwise generally center portion thereof where a conductive layer was to be formed, and portions where photoresists covering both of the widthwise side end surfaces of the insulating base layer and the metal supporting layer were formed. Then, the photoresist covering the upper surface of the insulating base layer, and the photoresists covering both of the widthwise side end surfaces of the insulating base layer and the metal supporting layer were exposed to light from thereabove via a photomask.

The photomask had a mask pattern made of light shielding portions and light transmitting portions, and was placed to position the light shielding portions thereof in opposing relation to the portions of the photoresist corresponding to the portions where the conductive layer and the end-portion conductive layers were to be formed and to the photoresists covering both of the widthwise side end portions of the insulating base layer and the metal supporting layer, and position the light transmitting portions thereof in opposing relation to the portions of the upper surface of the insulating base layer where plating resists were to be formed. Then, the photoresists were exposed to an ultraviolet ray at 130 mJ/cm$^2$ from thereabove via the photomask (see FIG. 2(d)).

Then, the photoresists covering both of the widthwise side end surfaces of the insulating base layer and the metal supporting layer were exposed to an ultraviolet ray at 260 mJ/cm$^2$ from therebelow (see FIG. 3(e)).

Then, the unexposed portions of the photoresists were removed by development, while the exposed portions thereof were formed into the pattern, and then dried to form the plating resists (see FIG. 3(f)).

Then, the end-portion conductive layers and the conductive layer were simultaneously formed over both of the widthwise end portions of the upper surface of the insulating base layer which were exposed from the plating resists and over the widthwise generally center portion thereof which was exposed from the plating resists, respectively (see FIG. 3(g)). The thickness of the conductive pattern (the end-portion conductive layers and the conductive layer) was about 9 μm, and the width (W1) of the end-portion conductive layer was 5000 μm.

Then, the plating resists and the portions of the conductive thin film where the plating resists were formed were successively removed by etching (see FIG. 4(h)).

Then, a varnish of a photosensitive polyamic acid resin was uniformly coated on the entire upper surfaces of the insulating base layer and the conductive pattern, dried, exposed to light, developed, and then further cured by heating to form an insulating cover layer made of polyimide with a thickness of 5 μm in the foregoing pattern (see FIG. 4(j)).

Thereafter, the resin supporting layer was removed by stripping (see FIGS. 1 and 4(j)).

In this manner, the COF board was obtained.

Comparative Example 1

Figure 6:
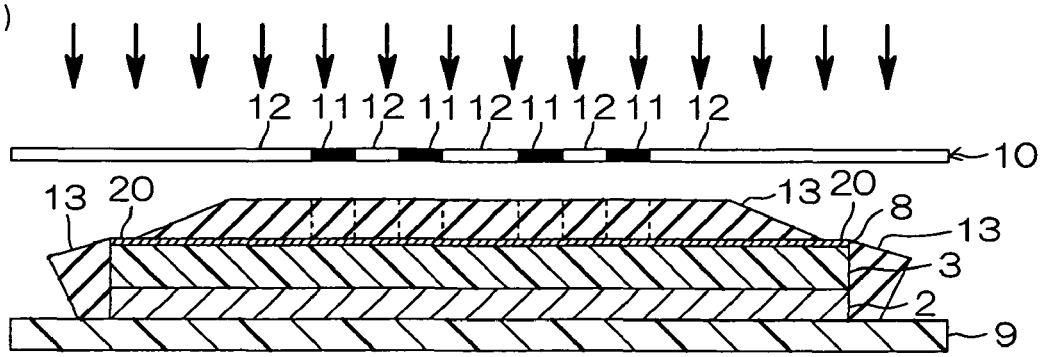
FIG. 6 is a process view of a producing method of a COF board according to COMPARATIVE EXAMPLE 1, (a) showing the step of placing a photomask so as to light-shield only a widthwise center portion where a conductive layer is to be formed, and exposing photoresists to light from thereabove via the photomask, (b) showing the step of forming the exposed portions of the photoresists into a pattern by removing the unexposed portions thereof to form plating resists, and (c) showing the step of forming the conductive layer over an insulating base layer exposed from the plating resists.
Figure 6:
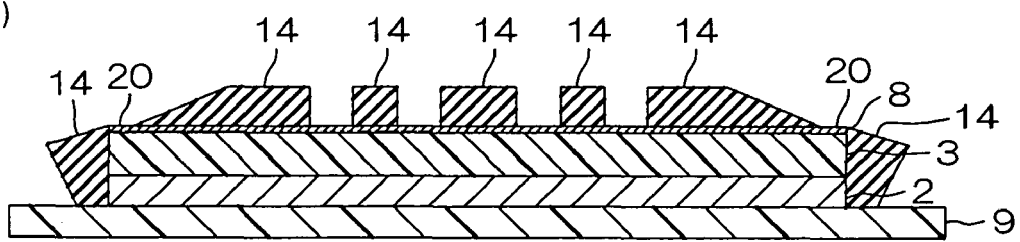
Figure 6:
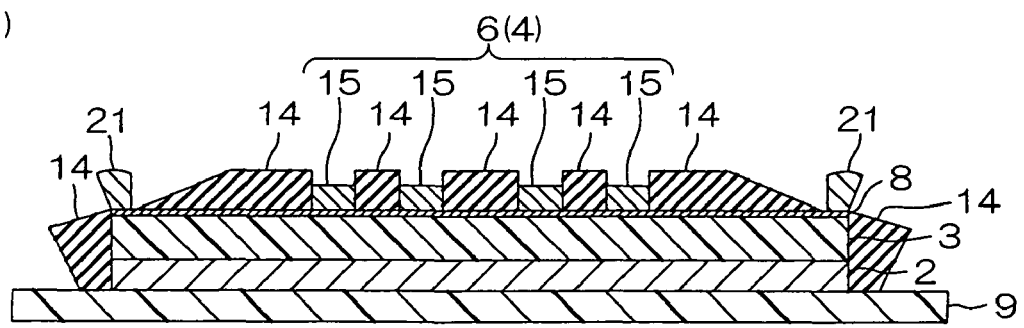

As shown in FIG. 6(a), a COF board (1) was obtained by the same process (see FIGS. 6(b) and 6(c)) as performed in EXAMPLE 1 except that, in exposing photoresists (13) to light from thereabove, a photomask (10) was placed so as to light-shield only a widthwise center portion where a conductive layer (6) was to be formed, and the photoresist (13) covering the upper surface of an insulating base layer (3) and the photoresists (13) covering both of the widthwise side end surfaces of the insulating base layer (3) and a metal supporting layer (2) were exposed to light from thereabove via the photomask (10).

As shown in FIG. 6(a), the photomask (10) mentioned above was placed to position light-shielding portions (11) thereof in opposing relation to the portion of the photoresist (13) where the conductive layer (6) was to be formed, and position light transmitting portions (12) thereof in opposing relation to the photoresists (13) covering both of the widthwise side end surfaces of the insulating base layer (3) and the metal supporting layer (2) and to the portions of the photoresist (13) corresponding to the portions of the upper surface of the insulating baser layer (3) where plating resists (14) were to be formed.

Comparative Example 2

As shown in FIG. 7(a), a COF board (1) was obtained by the same process (see FIGS. 7(b) and 7(c)) as performed in EXAMPLE 1 except that, in exposing photoresists (13) to light from thereabove, a photomask (10) was placed so as to light-shield only a widthwise center portion where a conductive layer (6) was to be formed, and both widthwise end portions where end-portion conductive layers (7) were to be formed, and the photoresist (13) covering the upper surface of an insulating base layer (3) and the photoresists (13) covering both of the widthwise side end surfaces of the insulating base layer (3) and a metal supporting layer (2) were exposed to light from thereabove via the photomask (10) and were not exposed to light from therebelow (see FIG. 3(e)).

As shown in FIG. 7(a), the photomask (10) mentioned above was placed to position light-shielding portions (11) thereof in opposing relation to the portions of the photoresist (13) where the conductive layer (6) and the end-portion conductive layers (7) were to be formed, and position light transmitting portions (12) thereof in opposing relation to the photoresists (13) covering both of the widthwise side end surfaces of the insulating base layer (3) and the metal supporting layer (2) and to the portions of the photoresist (13) corresponding to the portions of the upper surface of the insulating base layer (3) where plating resists (14) were to be formed.

However, due to a slight displacement of the photomask (10) on one widthwise side, the light shielding portion (11) was placed undesirably to oppose even the portion of the photoresist (13) covering the one widthwise end surface of each of the insulating base layer (3) and the metal supporting layer (2) which was in contact with the insulating base layer (3) and the metal supporting layer (2), as indicated by the imaginary lines in FIG. 7(a), and the portion of the photoresist (13) in contact with the insulating base layer (3) and the metal supporting layer (2) was removed by development, as shown in FIG. 7(b).

As a result, in electrolytic copper plating, a precipitate of copper (22) with a width of 10 to 50 μm occurred on one widthwise end surface of the metal supporting layer (2).

(Evaluation)

(1) Foreign Matter of Copper Over End Portions of Upper Surface of Insulating Base Layer In each of the COF boards obtained in EXAMPLE 1 and COMPARATIVE EXAMPLES 1 and 2, both of the widthwise end portions of the upper surface of the insulating base layer were observed using a metal microscope and a SEM.

As a result, it was recognized in each of the COF boards obtained in EXAMPLE 1 and COMPARATIVE EXAMPLE 2 that the end-portion conductive layers were formed on both of the widthwise end portions of the upper surface of the insulating base layer.

By contrast, in the COF board obtained in COMPARATIVE EXAMPLE 1, it was recognized that copper (21) was unintentionally precipitated on the edges of both of the widthwise end portions of the upper surface of the insulating base layer (3) due to vacant portions (20) where the plating resists (14) were missing, and the copper (21) came off to form a foreign matter.

(2) Precipitation of Copper on Side End Surface of Metal Supporting Layer

In each of the COF boards obtained in EXAMPLE 1 and COMPARATIVE EXAMPLES 1 and 2, both of the widthwise side end surfaces of the metal supporting layer were observed using a metal microscope and a SEM.

As a result, it was recognized in each of the COF boards obtained in EXAMPLE 1 and COMPARATIVE EXAMPLE 1 that copper was not precipitated.

By contrast, in the COF board obtained in COMPARATIVE EXAMPLE 2, it was recognized that the copper (22) was precipitated on one widthwise side end surface (left side end surface in FIG. 7) of the metal supporting layer (2), and the copper (22) came off to form a foreign matter.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A producing method of a wired circuit board, the producing method comprising the steps of:
   preparing a two-layer base material in which a synthetic resin insulating layer is laminated on a metal supporting layer formed of a metal foil;
   covering an upper surface of the insulating layer and respective side end surfaces of the insulating layer and the metal supporting layer with a photoresist;
   placing a photomask so as to light-shield an end portion where an end-portion conductive layer is to be formed on the upper surface of the insulating layer and a portion where a conductive layer is to be formed on the upper surface of the insulating layer, and exposing to light the photoresist covering the upper surface of the insulating layer from above the photoresist via the photomask;
   exposing to light the photoresist covering the respective side end surfaces of the insulating layer and the metal supporting layer from below the photoresist;
   forming an exposed portion of the photoresist into a pattern by removing an unexposed portion thereof to form a plating resist;
   forming said end-portion conductive layer on the end portion of the upper surface of the insulating layer which is exposed from the plating resist, while simultaneously forming said conductive layer on the portion of the upper surface of the insulating layer which is exposed from the plating resist; and removing the plating resist.

2. The producing method of the wired circuit board according to claim 1, wherein the photoresist is formed from a dry film resist.

3. The producing method of the wired circuit board according to claim 1, wherein the step of covering the upper surface of the insulating layer and the respective side end surfaces of the insulating layer and the metal supporting layer includes laminating a resin supporting layer on a lower surface of the metal supporting layer such that the metal supporting layer and the photoresist covering the side end surface of the metal supporting layer are included therein, and wherein the resin supporting layer is formed of a resin material that is operative to transmit light.

4. The producing method of the wired circuit board according to claim 1, further comprising, after the covering step, the step of:
 heating the photoresist covering the respective side end surfaces of the insulating layer and the metal supporting layer.

* * * * *